(12) United States Patent
Trivedi

(10) Patent No.: US 7,176,096 B1
(45) Date of Patent: Feb. 13, 2007

(54) TRANSISTOR GATE AND LOCAL INTERCONNECT

(75) Inventor: Jigish D. Trivedi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/631,921

(22) Filed: Jul. 31, 2003

Related U.S. Application Data

(62) Division of application No. 09/360,703, filed on Jul. 26, 1999, now Pat. No. 6,630,718.

(51) Int. Cl.
- *H01L 21/336* (2006.01)
- *H01L 21/3205* (2006.01)
- *H01L 21/44* (2006.01)

(52) U.S. Cl. .................. 438/305; 438/592; 438/655

(58) Field of Classification Search ............. 438/301, 438/305, 592, 586, 595, 655; 257/E21.296, 257/E21.507

See application file for complete search history.

(56) References Cited

U.S. PATENT DOCUMENTS

| | | | |
|---|---|---|---|
| 4,935,380 A * | 6/1990 | Okumura | 438/301 |
| 5,441,914 A | 8/1995 | Taft et al. | |
| 5,589,417 A | 12/1996 | Jeng | |
| 5,605,854 A * | 2/1997 | Yoo | 438/305 |
| 5,640,342 A | 6/1997 | Gonzalez | |
| 5,691,228 A | 11/1997 | Ping et al. | |
| 5,721,171 A | 2/1998 | Ping et al. | |

(Continued)

Primary Examiner—Michael Lebentritt
Assistant Examiner—Ron Pompey

(74) Attorney, Agent, or Firm—Knobbe, Martens, Olson & Bear LLP

(57) ABSTRACT

A method of forming a local interconnect for a semiconductor integrated circuit, the local interconnect comprising a refractory silicide contact having a substantially small sheet resistance formed at an exhumed surface of a gate stack, wherein the local interconnect electrically couples a gate electrode of the gate stack with an active region of the semiconductor substrate. The method of forming the local interconnect comprises depositing a gate oxide layer over the substrate, a first polysilicon layer over the gate oxide layer, a laterally conducting layer over the polysilicon layer, a second polysilicon layer over the laterally conducting layer, and an insulating layer over the second polysilicon layer. The intermediate structure is then etched so as to form a plurality of gate stacks. A surface of the second polysilicon layer of a gate stack is exhumed so as to allow subsequent formation of the refractory silicide contact at the exhumed surface. A plurality of spacers are formed along the vertical surfaces of the gate stacks and the substrate is selectively doped so as to form active regions within the substrate. A layer of titanium is deposited over the substrate and a silicon source and/or hardmask material layer is deposited over the titanium layer so as to extend between the gate electrode and the active region of the silicon. The mask layer is then patterned in an etching process so that the mask layer defines the extent of the local interconnect structure. The intermediate structure is then exposed to a high temperature N2/NH3 ambient which induces the formation of refractory silicide contacts at the exhumed surface of the polysilicon layer of the gate stack and at the active region of the substrate as well as the formation of refractory nitride (TiN) at the exposed portions of the titanium layer. A selective wet etch follows which removes the exposed unreacted titanium and exposed titanium nitride and leaves behind the local interconnect.

24 Claims, 3 Drawing Sheets

U.S. PATENT DOCUMENTS

| | | |
|---|---|---|
| 5,744,398 A | 4/1998 | Byun et al. |
| 5,756,394 A | 5/1998 | Manning |
| 5,792,687 A | 8/1998 | Jeng et al. |
| 5,804,499 A | 9/1998 | Dehm et al. |
| 5,851,875 A | 12/1998 | Ping |
| 5,869,389 A | 2/1999 | Ping et al. |
| 5,882,979 A | 3/1999 | Ping et al. |
| 5,899,742 A | 5/1999 | Sun |
| 5,939,758 A | 8/1999 | Arima |
| 5,945,350 A | 8/1999 | Violette et al. |
| 5,994,193 A | 11/1999 | Gardner et al. |
| 6,100,185 A | 8/2000 | Hu |
| 6,110,812 A | 8/2000 | Ho et al. |
| 6,130,145 A * | 10/2000 | Ilg et al. .................... 438/592 |
| 6,156,630 A | 12/2000 | Iyer |
| 6,174,764 B1 | 1/2001 | Manning |
| 6,211,054 B1 | 4/2001 | Li et al. |
| 6,255,701 B1 | 7/2001 | Shimada |
| 6,436,805 B1 | 8/2002 | Trivedi |
| 6,500,710 B2 * | 12/2002 | Nakagawa .................. 438/257 |
| 2002/0048946 A1 | 4/2002 | Tang et al. |

* cited by examiner

TRANSISTOR GATE AND LOCAL INTERCONNECT

RELATED APPLICATIONS

This application is a divisional of U.S. patent application Ser. No. 09/360,703 filed Jul. 26, 1999 and issued as U.S. Pat. No. 6,630,718 Oct. 7, 2003 which is incorporated herein in its entirety by reference.

BACKGROUND OF THE INVENTION

1. Field of the Invention

The present invention relates to semiconductor integrated circuit fabrication, devices and methods, and, in particular, is directed toward the method of forming a unique silicide local interconnect structure that extends from an exhumed gate electrode.

2. Description of the Related Art

As is well known in the semiconductor processing industry, refractory silicides are often used to form local interconnects between circuit nodes in a semiconductor integrated circuit. In particular, when a refractory metal, for example titanium (Ti), is deposited flushly adjacent a silicon material and exposed to a sufficiently high temperature, the refractory metal will react with the silicon material to form a refractory silicide contact, for example titanium silicide ($TiSi_2$). Since the resulting silicide contact has a relatively low sheet resistance, interconnects having silicide contacts can be formed with a reduced size, thereby enabling increased circuit density.

While silicides are very versatile as materials for forming interconnecting structures in integrated circuits, in some applications the suicides may poorly interconnect to particular semiconductor devices. For example, with some exhumed contact structures, the processing steps may result in the interconnect structure being undercut at an exposed region adjacent the exhumed contact which can result in either a higher resistance contact or an open contact which may be inadequate for a particular application.

For example, FIG. 1 illustrates a known exemplary method of forming a silicide local interconnect 200 in a typical semiconductor device. In particular, the device comprises a plurality of gate stacks 204 that are preformed with a gate oxide layer 212 deposited on a substrate 208, a polysilicon layer 214 deposited on the gate oxide layer 212, a laterally conducting tungsten silicide (WSix) layer 210 deposited on the polysilicon layer 214, and an insulating layer 216 deposited over the tungsten silicide layer 210.

In this example, the local interconnect 200 extends between an exhumed surface 202 of the gate stack 204a and a distally positioned active region 206 of the substrate 208. In particular, the exhumed surface 202 corresponds to the upper surface of the laterally conductive tungsten silicide layer 210 of the gate stack 204a and the active region 206 of the substrate 208 corresponds to a source/drain surface region of an isolated CMOS transistor.

To form the interconnect 200, a layer of refractory metal, such as titanium (Ti) 218 is deposited above the silicon substrate 208 so that the refractory metal layer 218 contacts both the exhumed surface 202 of the gate stack 204a and the active region 206 of the substrate 208. A masking layer 220 is then deposited over the refractory metal layer 218 and etched so as to define the extent of the local interconnect 200. The masking layer 220, which may comprise silicon, polysilicon, silicon rich tungsten silicide, or silicon oxynitride, also acts as a source of silicon to promote silicide formation along the length of the interconnect 200 during a subsequent annealing process. The device then undergoes the well-known high temperature annealing process which transforms the refractory metal into a silicide, such as titanium silicide ($TiSi_2$), at the active region 206 of the substrate 208 and at the exhumed surface 202 of the gate stack 204a. The transformation of the refractory material into a silicide at these locations results in a desirable low resistance contact between the exhumed contact, the active area and the interconnect. Subsequently, a selective wet etching process is then used to remove exposed excess refractory metal and other exposed refractory metal byproducts. Thus, the remaining refractory material positioned underneath the masking layer 220 forms the local interconnect 200 having titanium silicide contacts 222 and 224 formed at the exhumed surface 202 of the gate stack 204a and active region 206 of the substrate 208 respectively.

However, FIG. 1 illustrates a common problem associated with this kind of interconnect. In particular, since the exhumed tungsten silicide surface 202 is often a relatively poor source of silicon and since the width of the exhumed surface 202 is often relatively small, an underproduction of titanium silicide during annealing at the exhumed surface 202 often results. Thus, the selective wet etching process often results in the silicide contact 222 having a very severe undercut 226, as shown in FIG. 1. Consequently, the resistance of the titanium silicide contact 222 formed at the exhumed surface 202 of the gate stack 204a may be relatively large. Thus, circuit performance may be compromised and production yields may be decreased. Moreover, such problematic local interconnects may limit the extent of selective wet cleans, which could impede the development of increasingly reduced circuit dimensions.

From the foregoing, it will be appreciated that there is a need for an improved method of forming local interconnects that extend from an exhumed surface of a gate stack. In particular, there is a need for an improved method that results in the contact formed at the exhumed surface of the gate stack having a decreased resistance. To this end, there is a need for the local interconnect to be formed such that undercutting of the material at the exhumed surface of the gate stack is substantially reduced. Furthermore, there is a need for such a local interconnect to be formed in a simple and, therefore, cost effective manner.

SUMMARY OF THE INVENTION

The aforementioned needs are satisfied by the integrated circuit of the present invention. According to one aspect of the invention, the integrated circuit comprises a semiconductor substrate and a first electrical structure formed in the semiconductor substrate. The integrated circuit further comprises a gate stack formed on the semiconductor substrate, the gate stack having at least one conductive layer and a source layer positioned on the conductive layer. The integrated circuit further comprises a local interconnect interconnecting the conductive layer of the gate stack to the first electrical structure. In particular, the local interconnect is attached to the gate stack at an exhumed surface adjacent the layer of source material. Moreover, the local interconnect includes a conductive material to provide a low resistance contact with the first electrical structure formed in the semiconductor substrate. The source layer provides transforming atoms to the material used to form the local interconnect during formation such that the density of dopant atoms in the material used to form the local interconnect during formation is sufficient to substantially prevent undercutting of the local interconnect at the connection to the gate stack.

In one embodiment, the conductive material used to form the local interconnect comprises a refractory metal. In this embodiment, the refractory metal preferably comprises titanium and the source layer provides silicon atoms such that a titanium silicide local interconnect is formed.

Another aspect of the invention comprises a method of forming a local interconnect on a semiconductor integrated circuit. The method comprises forming a gate stack having at least one conductive layer and a source layer positioned on top of the at least one conductive layer, the source layer providing a source of transforming atoms. The method further comprises exhuming a first layer of the gate stack so as to expose a portion of the source layer. The method further comprises depositing a refractory metal on the integrated circuit so that the refractory metal contacts the exposed portion of the source material of the gate stack and so that the refractory metal is positioned on another device of the integrated circuit. The method further comprises transforming the refractory metal into a conductive material wherein the source material provides transforming atoms to the portion of the refractory metal positioned adjacent the exposed portion of the source material.

In one embodiment, the transforming atoms are comprised of silicon such that the local interconnect forms a silicide material at the exhumed contact. In this embodiment, the method of forming a local interconnect further comprises removing the excess refractory material such that the refractory silicide contact is substantially preserved. In this embodiment, the source material provides sufficient silicon atoms to the refractory material during transformation of the refractory material to reduce undercutting of the refractory silicide contact at the exposed surface of the source material.

From the foregoing, it should be apparent that the local interconnect of the integrated circuit of the present invention is improved over those known in the art. In particular, since the source material of the gate stack readily supplies source atoms to the refractory metal to abundantly form a silicide contact at the gate stack, the problem of undercutting at the exhumed surface of the gate stack is substantially reduced. These and other objects and advantages of the present invention will become more apparent from the following description taken in conjunction with the accompanying drawings.

DETAILED DESCRIPTION OF THE PREFERRED EMBODIMENT

Figure 2:
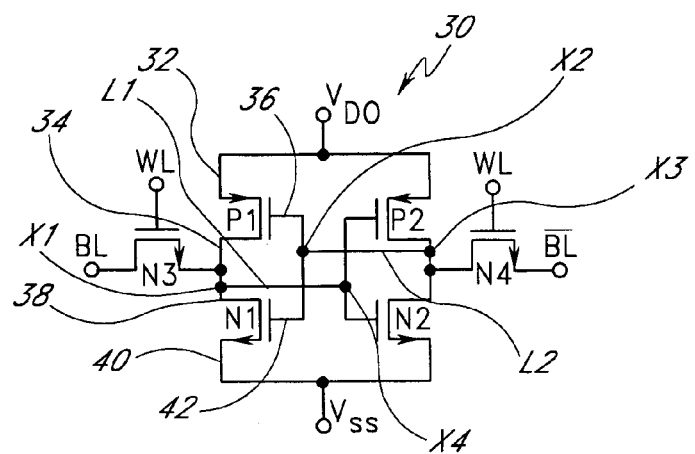
FIG. 2 is a schematic diagram of an exemplary conventional CMOS SRAM circuit.

Reference will now be made to the drawings wherein like numerals refer to like parts throughout. As is understood in the art, interconnects are used to interconnect various circuit components of semiconductor devices. To provide context and background, a circuit diagram of a typical integrated circuit formed on a semiconductor substrate is initially described in connection with FIG. 2. The circuit illustrated in FIG. 2 is simply one example of a typical circuit formed on an integrated circuit that requires the use of low resistance local interconnects. It will be appreciated from the following discussion that local interconnects are used in many different types of integrated circuits including SRAM, DRAM and other non-memory circuits and, as such, the present invention should not be limited to only the circuit of FIG. 2. The process by which the interconnect of the illustrated embodiment will be described in greater detail below in connection with FIGS. 3–7.

As shown in FIG. 2, an exemplary SRAM device 30 comprises six CMOS transistors P1, P2, N1, N2, N3 and N4 connected together in a symmetrical configuration. In particular, the transistor P1, having a source 32, a drain 34, and a gate 36, and the transistor N1, having a source 38, a drain 40, and a gate 42, are configured such that the drain region 34 of P1 couples with the source region 38 of N1 at a node X1 and such that the gate regions 36 and 42 are interconnected at a node X2. Likewise, the transistors P2 and N2 are configured in a similar manner such that the drain region of P2 couples with the source region of N2 at a node X3 and such that the gate regions interconnect at a node X4. As shown in FIG. 2, the SRAM device further comprises a local interconnect L1 and a local interconnect L2. In particular, the local interconnect L1 cross-couples the node X1 with the Node X4, whereas the local interconnect L2 cross-couples the node X2 with the node X3. Thus, the local interconnects L1 and L2 are each required to interconnect a gate electrode with an active source/drain region.

As is illustrated by this exemplary circuit, various circuit components formed in a semiconductor substrate have to be interconnected via low resistance interconnection paths. Typically, various semiconductor structures, such as the CMOS gates, are formed at different locations on a semiconductor wafer and silicide interconnects are formed so as to be electrically coupled to the semiconductor devices and thereby electrically interconnect the devices with a low resistance path. As discussed above, it is desirable that the local interconnects between devices of a circuit, such as a SRAM or DRAM circuit, have as low of resistance as possible.

Figure 1:
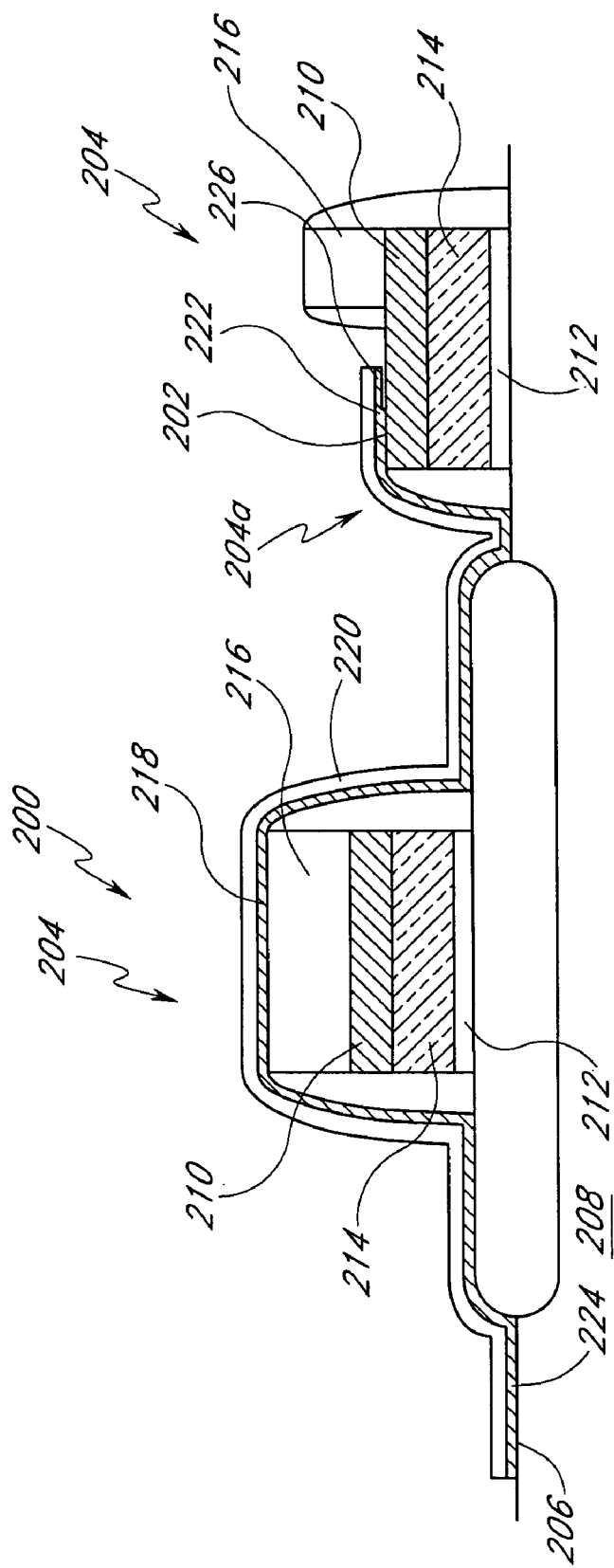
FIG. 1 is a partial schematic sectional view of a conventionally formed silicide local interconnect.

Reference will now be made to FIGS. 3 through 7 which illustrate a method of forming the local interconnect, such as the interconnect L1 of FIG. 1. In particular, the local interconnect is formed between an exhumed gate electrode 60 (FIG. 7) and an active source/drain region 62 of a semiconductor substrate 64. However, it will be appreciated that the method described hereinbelow could be adapted to form a similar local interconnect that couples the gate electrode with a different circuit node, such as another gate electrode.

Figure 3:
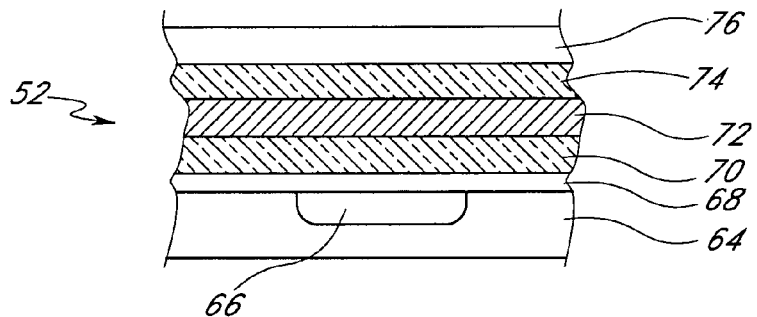
FIGS. 3–7 are partial schematic sectional views of the integrated circuit of the present invention which schematically illustrates the method of forming an improved local interconnect.

As shown in FIG. 3, the semiconductor substrate 64, preferably formed of silicon, is prepared with isolation regions 66 using a conventional isolation process, such as local oxidation of silicon (LOCOS) or STIC shallow trench isolation. The isolation regions 66 are used to define active areas of the substrate. In these applications, the active areas will contain the source/drain regions of the transistors forming the memories.

As shown in FIG. 3, a plurality of blanket layers 52 are then deposited over the substrate 64. In particular, the blanket layers 52 comprise a blanket gate oxide layer 68, a blanket polysilicon layer 70, a blanket conductive layer 72, a blanket source layer 74, and a blanket cap insulating layer 76. Specifically, a blanket layer is defined in this application as a substantially planar layer that extends substantially beyond the local interconnect. In one embodiment, the blanket layers 52, 68, 70, 72, 74 and 76 can cover an entire wafer of semiconductor substrate material.

In one embodiment, the gate oxide layer 68, preferably having a thickness between 20 Angstroms and 100 Angstroms is first deposited over the substrate 64. The gate oxide layer 68 will be patterned and etched so as to form a portion of the gate of a transistor as will be described in greater detail below.

Overlying the gate oxide layer 68 in this embodiment is the layer of polysilicon 70 having a thickness between 300 Angstroms and 1000 Angstroms. The polysilicon layer 70 is substantially conductive along an outward direction that is perpendicular to the plane of the polysilicon layer 70 and helps to activate the gate of the transistor. Overlying the polysilicon layer 70 is the layer 72 of conductive material, such as tungsten silicide (WSix), having a thickness between 100 Angstroms and 1000 Angstroms. The tungsten silicide layer 72 is substantially conductive along a lateral direction that is parallel to the plane of the layer 72 so as to allow for better lateral transmission of current over extended regions of the integrated circuit.

Overlying the conductive layer 72 in this embodiment is the silicon-rich source layer 74, such as polysilicon, having a thickness between 100 Angstroms and 1000 Angstroms. As will be described in greater detail hereinbelow, the source layer 74 provides a source of transforming atoms, such as silicon atoms, during a subsequent annealing step to permit better formation of a silicide local interconnect between adjacent structures on the semiconductor surface. Overlying the silicon-rich layer 74 in this embodiment is the cap insulating layer 76 formed of either silicon oxide ($SiO_2$) or silicon nitride having a thickness between 1000 Angstroms and 3000 Angstroms. The cap insulating layer 76 is formed, in one embodiment, using well-known oxidation techniques and acts to provide additional isolation between adjacent devices.

Figure 4:
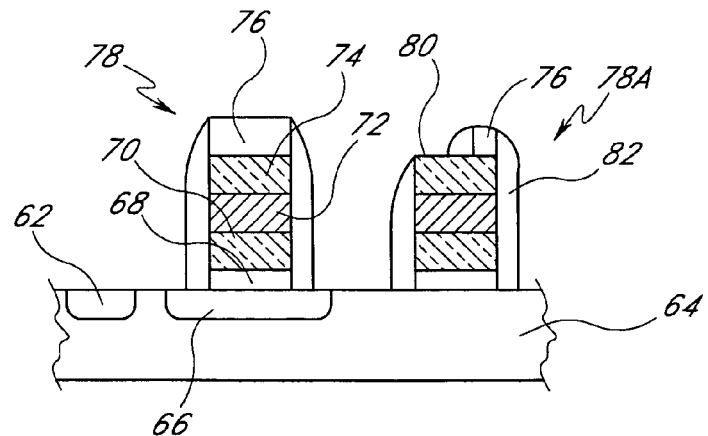

As shown in FIG. 4, material from the plurality of blanket layers 52 of FIG. 3 is selectively removed to form a plurality of gate stacks 78. In particular, the gate stacks 78 may be formed using conventional mask and etch technology in a well-known manner. Thus, each of the gate stacks 78 comprises the gate oxide layer 68, the polysilicon layer 70, the conducting layer 72, the silicon-rich source layer 74, and the cap insulating layer 76.

As shown in FIG. 4, a portion of the cap insulating layer 76 of a gate stack 78a is then removed so as to exhume a surface of the silicon-rich layer 74, hereinbelow referred to as the exhumed surface 80. In particular, the exhumed surface 80 of FIG. 4 corresponds to the node of an integrated circuit that is to be interconnected via a local interconnection of the illustrated embodiment. The exhumed contact can, for example, comprise the node X4 of the circuit shown in FIG. 2.

As shown in FIG. 4, following the formation of the gate stacks 78 and the exhumation of the exhumed surface 80, a plurality of vertical spacers 82 are formed along the vertical edges of the gate stacks. In particular, the spacers 82 may be formed in a well-known manner of either undoped silicon dioxide or silicon nitride. Furthermore, the spacers provide electrical isolation between the exhumed surface and overlying structures of the device (not shown).

As shown in FIG. 4, the active region 62 of the substrate can also be configured using known doping techniques, such as ion implantation, so as to form a source/drain region of a MOSFET transistor. Thus, the active region 62 of FIG. 4 can, for example, correspond to the node X1 of the circuit shown in FIG. 2.

Figure 5:
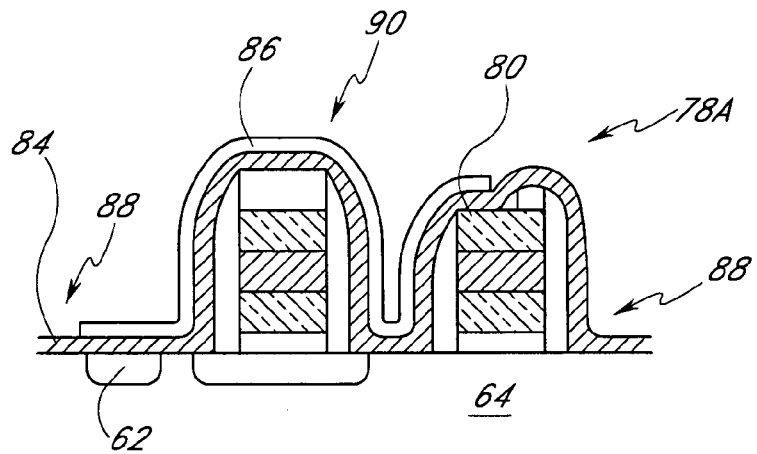

As shown in FIG. 5, a blanket refractory metal layer 84 is deposited over the intermediate structure of FIG. 4 so as to overlay the active area 62 of the substrate 64 and the exhumed surface 80 of the gate stack 78a. The refractory metal layer 84 is deposited using well-known metal deposition techniques, such as sputtering and the like. Preferably, the refractory metal is a metal that will form a low resistance silicide or nitride during a subsequent annealing step as will be described below. In one embodiment, the refractory metal layer 84 comprises titanium having a thickness between 100 Angstroms and 500 Angstroms.

As shown in FIG. 5, a masking layer 86 is deposited over the refractory metal layer 84 and subsequently etched so as to define the extent of the local interconnect. Thus, the masking layer 86 defines an exposed region 88 that extends beyond the masking layer 86 and a covered region 90 that lies underneath the masking layer 86. In one embodiment, the masking layer 86 is substantially comprised of tungsten silicide (WSix) material. In another embodiment, the masking layer 86 is formed of a silicon material. In yet another embodiment, the masking layer 86 is formed of a polysilicon material. In still yet another embodiment, the masking layer 86 is formed of a silicon oxynitride material.

The intermediate structure of FIG. 5 then undergoes an annealing process such that it is exposed to a high temperature environment with an N2/NH3 ambient source. This preferably comprises exposing the refractory material to a rapid thermal processing environment having the N2/NH3 ambient so as to increase the temperature of the refractory material to a value between 600 degrees Celsius and 750 degrees Celsius for a period of time between 10 seconds and 60 seconds. In one particular embodiment, the titanium refractory material is annealed by raising its temperature to a value of 710 degrees Celsius for a time period of between 20 and 30 seconds in the presence of the N2/NH3 ambient.

Figure 6:
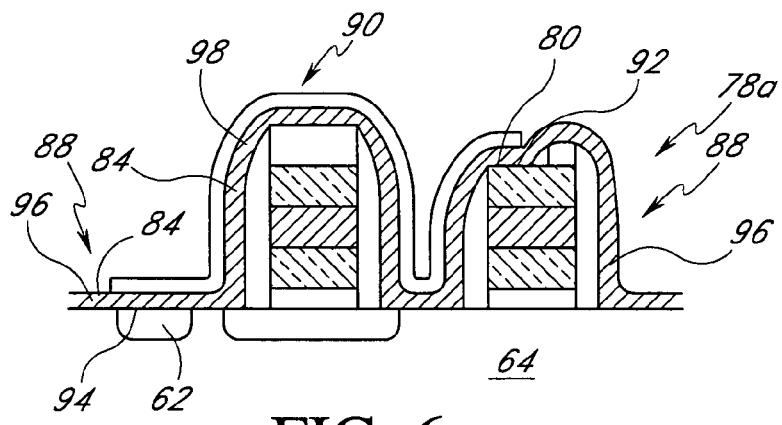

Thus, the refractory metal layer 84 is induced to react with silicon from the silicon-rich source layer 74 of the gate stack 78a to form a refractory silicide contact 92 at the exhumed surface 80 of the gate stack 78a as shown in FIG. 6. Likewise, a refractory silicide contact 94 is also formed at the active region 62 of the substrate 64. Furthermore, the exposed region 88 of the refractory metal 84 which is exposed to the N2/NH3 ambient will form refractory nitride 96. Moreover, if the masking layer 86 is formed of polysilicon, the covered region 90 of the refractory metal 84 will combine with silicon from the masking layer 86 to form a conductive layer 98 of refractory silicide that extends between the refractory silicide contacts 92 and 94. Alternatively, if the masking layer 86 is a poor source of silicon, such as tungsten silicide (WSix), the conductive path 98 between the refractory silicide contacts is substantially provided by the unreacted refractory metal 84 in the covered region 90.

Figure 7:
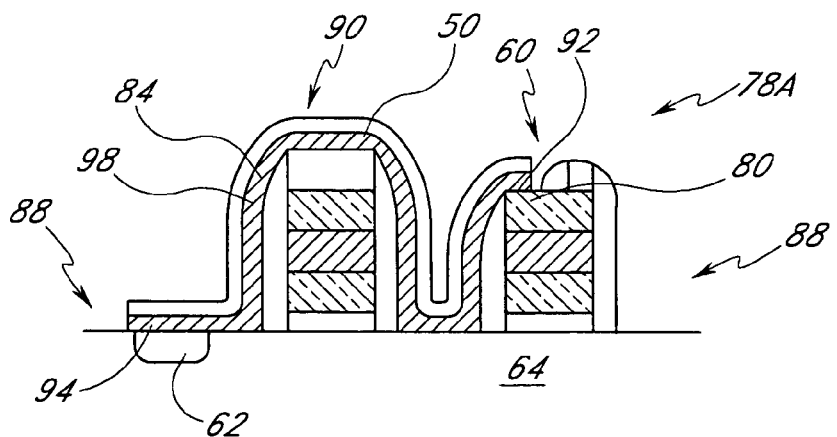

The intermediate structure of FIG. 6 is then exposed to a wet etching process that removes excess refractory material and leaves behind the local interconnect 50, as shown in FIG. 7. In particular, an etchant which selectively removes refractory nitride and refractory metal material, such as H2O:H2O2:NH4OH having a ratio of 1:0.25:0.25, removes the refractory nitride 96 and unreacted refractory metal 84 of FIG. 5 from the exposed region 88. Furthermore, since the etchant does not substantially remove refractory silicide material, the refractory silicide contacts 92 and 94 are substantially unaffected by the etchant. Moreover, since the covered region 90 of the refractory metal 84 either combines with silicon from the masking layer 86 to form a refractory silicide layer 98 or is protected by the masking layer 86, the covered region 90 of the local interconnect 50 remains unaffected by the wet etching process. Thus, the resulting local interconnect 50 provides a substantially low resistance conductive path between the exhumed surface 80 of the gate stack 78a and the active region 62 of the substrate 64.

It will be appreciated that the silicide contact 92 of the interconnect 50 formed at the exhumed surface 80 of the gate stack 78a is formed with a substantially small sheet resistance. In particular, since the exhumed layer 74 of the gate stack is a rich source of silicon atoms, the refractory metal 84 will readily react to generously form refractory silicide at the exhumed surface 80. Thus, at most, only a small amount of unreacted refractory metal remains at the exhumed surface 80 and a small amount of refractory nitride is formed at the exhumed surface 80. Therefore, the wet etch process described in connection with FIG. 7 does not substantially degrade of the refractory silicide contact 92. Consequently, the problem of undercutting of the refractory silicide contact 92, which exists in the prior art, is substantially reduced.

It will also be appreciated that the method of forming the interconnect 50 is relatively simple to implement. In particular, the only extra processing step is that of depositing the silicon-rich layer 74 during the formation of the gate stacks 78. Furthermore, since the silicon-rich layer 74 is selectively etched during the same etching process that selectively etches the oxide layer 68, the polysilicon layer 70, the conducting layer 72, and the cap insulating layer 76, no additional etching process is required.

It will be appreciated that the improved process of forming the interconnect so as to reduce undercutting allows for smaller contact geometries at exhumed contacts. Undercutting at the connection between the local interconnect and the exhumed contact is a more significant problem in smaller geometry devices. Hence, by developing a technique for reducing undercutting, smaller local interconnects can be used thereby facilitating higher scales of integration.

Although the preferred embodiment of the present invention has shown, described and pointed out the fundamental novel features of the invention as applied to this embodiment, it will be understood that various omissions, substitutions and changes in the form of the detail of the device illustrated may be made by those skilled in the art without departing from the spirit of the present invention. Consequently, the scope of the invention should not be limited to the foregoing description, but should be defined by the appended claims.

What is claimed is:

1. A method of forming a local interconnect on a semiconductor integrated circuit, the method comprising:

forming a gate stack on a substrate, the gate stack having at least one conductive layer and a source layer of a first thickness positioned on top of the at least one conductive layer so that the at least one conductive layer directly-contacts the source layer and at an uppermost surface of the gate stack, the source layer providing a rich source of silicon;

exhuming a first layer of the gate stack so as to expose a portion of the source layer above at least a portion of the gate stack so as to define a first circuit node;

depositing a refractory material so that the refractory material contacts the exposed uppermost portion of the source layer of the gate stack with the source layer substantially maintaining the first thickness and so that the refractory material is also positioned to contact a second circuit node of the integrated circuit having a rich source of the silicon;

forming a masking layer over the refractory material;

etching the masking layer so as to define an extent of the local interconnect;

selectively transforming the refractory material in a nitrogen containing ambient such that the refractory material underneath the etched masking layer and at least adjacent the exposed portion of the source layer and the second circuit node is transformed into low resistance contacts comprising refractory material silicide such that electrical contact between the refractory metal and the at least one conductive level occurs through the source layer and wherein the source layer provides silicon to the portion of the refractory material positioned adjacent the exposed uppermost portion of the source layer and wherein the refractory material beyond the extent of the local interconnect is transformed to comprise refractory material nitride; and performing a selective removal process such that the refractory material nitride and remaining refractory material beyond the extent of the local interconnect is preferentially removed and wherein the contacts comprising refractory material silicide are preferentially unresponsive to the selective removal process.

2. The method of claim 1, wherein the source layer provides the silicon to the refractory material during transformation of the refractory material such that the selective removal process reduces undercutting of the low resistance contact at the exposed surface of the source layer.

3. The method of claim 1, wherein forming a gate stack comprises:

depositing a plurality of blanket layers over a semiconductor substrate; and removing material from the plurality of blanket layers so as to define the gate stack.

4. The method of claim 3, wherein depositing a plurality of blanket layers over a semiconductor substrate comprises depositing a blanket gate oxide layer over the substrate.

5. The method of claim 4, wherein depositing a plurality of blanket layers over a semiconductor substrate further comprises depositing an outwardly conductive blanket layer over the blanket gate oxide layer.

6. The method of claim 5, wherein depositing an outwardly conductive blanket layer comprises depositing a first blanket polysilicon layer.

7. The method of claim 6, wherein depositing a plurality of blanket layers over a semiconductor substrate further comprises depositing a laterally conductive blanket layer over the outwardly conductive blanket layer.

8. The method of claim 7, wherein depositing a laterally conductive blanket layer comprises depositing a blanket layer of tungsten silicide.

9. The method of claim 8, wherein depositing a plurality of blanket layers over a semiconductor substrate further comprises depositing a blanket source layer over the blanket conducting layer.

10. The method of claim 9, wherein depositing a blanket source layer over the blanket conducting layer comprises depositing a second blanket polysilicon layer.

11. The method of claim 10, wherein depositing a second blanket polysilicon layer comprises depositing a second blanket polysilicon layer having a thickness between 100 Angstroms and 1000 Angstroms.

12. The method of claim 1, wherein exhuming a first layer of the gate stack comprises removing a portion of a cap insulating layer.

13. The method of claim 1, wherein depositing refractory material comprises depositing a blanket layer of titanium.

14. The method of claim 13, wherein depositing a blanket layer of titanium comprises depositing a blanket layer of titanium having a thickness between 100 Angstroms and 500 Angstroms.

15. The method of claim 1, wherein transforming the refractory material comprises annealing the refractory material in the nitrogen containing ambient.

16. The method of claim 15, wherein annealing the refractory material comprises exposing the refractory material to a rapid thermal processing environment having an N2/NH3 ambient so as to increase the temperature of the refractory material to a value between 600 degrees Celsius and 750 degrees Celsius for a period of time between 10 seconds and 60 seconds.

17. A method of forming a local interconnect on a semiconductor integrated circuit, the method comprising:

forming a gate stack having at least one conductive layer and a source layer of polysilicon of a first thickness positioned on top of the at least one conductive layer so that the polysilicon layer directly contacts the at least one conductive layer to define the source layer of polysilicon providing a rich source of silicon atoms;

exhuming a first layer of the gate stack so as to expose a portion of the source layer above at least a portion of the gate stack so as to define a first circuit node of the integrated circuit;

depositing a refractory material on the integrated circuit so that a portion of the refractory material contacts the exposed portion of the source layer of the gate stack with the polysilicon source layer substantially maintaining the first thickness and so that the refractory material is also positioned to contact a second circuit node of the integrated circuit also providing a rich source of the silicon atoms;

forming a masking layer over the refractory material;

etching the masking layer so as to define an extent of the local interconnect defined underneath the masking layer and with portions of the refractory material not underneath the etched masking layer comprising excess refractory material;

preferentially transforming at least portions of the refractory material underneath the masking layer and adjacent the exposed portion of the source layer and adjacent the second circuit node into conductive silicide contacts such that electrical contact between the refractory material and the at least one conductive layer occurs through the source layer wherein the source layer provides silicon atoms to the portion of the refractory material positioned adjacent the exposed portion of the source layer so as to form the respective silicide contact and wherein the transforming is performed in a nitrogen containing ambient such that the excess refractory material comprises refractory nitride following the preferential transforming; and selectively removing the excess refractory material such that the silicide contacts are preferentially unresponsive to the selective removing.

18. The method of claim 17, wherein forming a gate stack having at least one conductive layer and a source layer of polysilicon positioned on top of the at least one conductive layer comprises forming a gate stack with a refractory silicide layer immediately underneath a source layer of polysilicon.

19. The method of claim 18, wherein forming a gate stack with a refractory silicide layer immediately underneath a source layer of polysilicon comprises forming a gate stack with a tungsten silicide layer immediately underneath a source layer of polysilicon.

20. The method of claim 17, wherein depositing refractory material comprises depositing a blanket layer of refractory material comprised of titanium.

21. The method of claim 20, wherein preferentially transforming the refractory material comprises annealing the refractory material in a nitrogen containing ambient.

22. The method of claim 21, wherein selectively removing the excess refractory material comprises etching the exposed refractory material after annealing the refractory material with etchant which is selective for nitrides and substantially less reactive with suicides.

23. The method of claim 1, wherein the selective removal process comprises a wet etch process selective for nitrides and not for silicides.

24. The method of claim 1, wherein the masking layer is also a rich source of the transforming atoms and wherein the transforming of the refractory material occurs to substantially all of the refractory material underneath the etched masking layer.

* * * * *

UNITED STATES PATENT AND TRADEMARK OFFICE
CERTIFICATE OF CORRECTION

PATENT NO. : 7,176,096 B1  
APPLICATION NO. : 10/631921  
DATED : February 13, 2007  
INVENTOR(S) : Jigish D. Trivedi Page 1 of 1

It is certified that error appears in the above-identified patent and that said Letters Patent is hereby corrected as shown below:

Column 1

Line 34, delete "suicides" and insert -- silicides --.

Column 6

Line 62 - Delete "H2O:H2O2:NH4OH" and insert -- $H_2O:H_2O_2:NH_4OH$ --.

Column 7

Line 58, Claim 1, delete "directly-contacts" and insert -- directly contacts --.

Column 10

Line 34, Claim 22, after "comprises" insert -- : --.

Line 37, Claim 22, delete "suicides" and insert -- silicides --.

Signed and Sealed this

Second Day of September, 2008

JON W. DUDAS  
*Director of the United States Patent and Trademark Office*